US008043913B2

(12) United States Patent
Yilmaz et al.

(10) Patent No.: US 8,043,913 B2
(45) Date of Patent: Oct. 25, 2011

(54) METHOD OF FORMING TRENCH-GATE FIELD EFFECT TRANSISTORS

(75) Inventors: Hamza Yilmaz, Saratoga, CA (US); Daniel Calafut, San Jose, CA (US); Christopher Boguslaw Kocon, Mountaintop, PA (US); Steven P. Sapp, Santa Cruz, CA (US); Dean E. Probst, West Jordan, UT (US); Nathan L. Kraft, Pottsville, PA (US); Thomas E. Grebs, Mountaintop, PA (US); Rodney S. Ridley, Scarborough, ME (US); Gary M. Dolny, Mountaintop, PA (US); Bruce D. Marchant, Murray, UT (US); Joseph A. Yedinak, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 13/075,091

(22) Filed: Mar. 29, 2011

(65) Prior Publication Data

US 2011/0177662 A1    Jul. 21, 2011

Related U.S. Application Data

(60) Division of application No. 12/698,746, filed on Feb. 2, 2010, now Pat. No. 7,923,776, which is a continuation of application No. 12/404,909, filed on Mar. 16, 2009, now abandoned, which is a continuation of application No. 11/441,386, filed on May 24, 2006, now Pat. No. 7,504,303.

(60) Provisional application No. 60/685,727, filed on May 26, 2005.

(51) Int. Cl.
*H01L 21/336* (2006.01)

(52) U.S. Cl. ............... 438/259; 438/270; 257/E21.655

(58) Field of Classification Search .............. 438/259, 438/270–271, 283, 589; 257/E21.655
See application file for complete search history.

(56) References Cited

U.S. PATENT DOCUMENTS

| 4,893,160 A | 1/1990 | Blanchard |
| 4,941,026 A | 7/1990 | Temple |
| 5,801,417 A | 9/1998 | Tsang et al. |

(Continued)

FOREIGN PATENT DOCUMENTS

AT    504289 A2    4/2008

(Continued)

OTHER PUBLICATIONS

Miller, G., "Power Management & Supply—Market, Applications, Technologies—An Overview," Infineon Technologies A1 PS DD, 23.5.03, 51 pages.

(Continued)

*Primary Examiner* — Thanhha Pham
(74) *Attorney, Agent, or Firm* — Kilpatrick Townsend & Stockton LLP (57) ABSTRACT

A method of forming a field effect transistor includes: forming a trench in a semiconductor region; forming a shield electrode in the trench; performing an angled sidewall implant of impurities of the first conductivity type to form a channel enhancement region adjacent the trench; forming a body region of a second conductivity type in the semiconductor region; and forming a source region of the first conductivity type in the body region, the source region and an interface between the body region and the semiconductor region defining a channel region therebetween, the channel region extending along the trench sidewall. The channel enhancement region partially extends into a lower portion of the channel region to thereby reduce a resistance of the channel region.

18 Claims, 10 Drawing Sheets

U.S. PATENT DOCUMENTS

| | | | |
|---|---|---|---|
| 5,821,583 | A | 10/1998 | Hshieh et al. |
| 5,907,776 | A | 5/1999 | Hshieh et al. |
| 5,929,481 | A | 7/1999 | Hshieh et al. |
| 6,376,315 | B1 | 4/2002 | Hshieh et al. |
| 6,388,286 | B1 | 5/2002 | Baliga |
| 6,657,254 | B2 | 12/2003 | Hshieh et al. |
| 6,750,508 | B2 | 6/2004 | Omura et al. |
| 7,005,351 | B2 * | 2/2006 | Henninger et al. ............ 438/268 |
| 7,183,610 | B2 | 2/2007 | Pattanayak et al. |
| 7,345,342 | B2 | 3/2008 | Challa et al. |
| 7,504,303 | B2 | 3/2009 | Yilmaz et al. |
| 7,923,776 | B2 | 4/2011 | Yilmaz et al. |
| 2004/0016963 | A1 | 1/2004 | Baliga |
| 2005/0167742 | A1 | 8/2005 | Challa et al. |
| 2005/0208722 | A1 | 9/2005 | Peake et al. |
| 2005/0242392 | A1 | 11/2005 | Pattanayak et al. |
| 2009/0230465 | A1 | 9/2009 | Yilmaz et al. |

FOREIGN PATENT DOCUMENTS

| | | |
|---|---|---|
| DE | 112006001318 T5 | 4/2008 |
| EP | 1170803 A2 | 1/2002 |
| JP | 2008-513715 | 5/2008 |
| KR | 1020080015863 A | 2/2008 |
| WO | WO 02/078092 A1 | 10/2002 |
| WO | WO 2006/127914 A2 | 11/2006 |

OTHER PUBLICATIONS

International Search Report for PCT/US06/20274 filed May 15, 2008, 4 pages.

Written Opinion of the International Searching Authority for Application No. PCT/US2006/020274, mailed on May 15, 2008, 5 pages.

Preliminary Report on Patentability for Application No. PCT/US2006/020274, mailed on Apr. 9, 2009, 7 pages.

Non-Final Office Action for U.S. Appl. No. 12/404,909, mailed on Sep. 2, 2009, 12 pages.

Notice of Allowance for U.S. Appl. No. 11/441,386, mailed on Oct. 31, 2008, 10 pages.

Notice of Allowance for U.S. Appl. No. 12/698,746, mailed on Dec. 10, 2010, 6 pages.

* cited by examiner

METHOD OF FORMING TRENCH-GATE FIELD EFFECT TRANSISTORS

CROSS-REFERENCES TO RELATED APPLICATIONS

This application is a division of U.S. application Ser. No. 12/698,746, filed Feb. 2, 2010, which is a continuation of U.S. application Ser. No. 12/404,909, filed Mar. 16, 2009, now abandoned, which is a continuation of U.S. application Ser. No. 11/441,386, filed May 24, 2006, now U.S. Pat. No. 7,504,303, which claims the benefit of U.S. Provisional Application No. 60/685,727, filed on May 26, 2005. These disclosures are incorporated herein by reference in their entirety for all purposes.

The commonly assigned U.S. application Ser. No. 11/026,276, filed Dec. 29, 2004 is incorporated herein by reference in its entirety for all purposes.

BACKGROUND

The present invention relates to semiconductor power devices, and more particularly to improved trench-gate power devices and methods of manufacturing the same.

Figure 1:
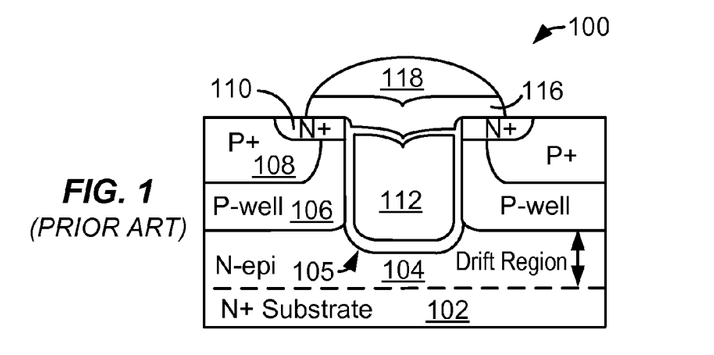
FIG. 1 is a cross section view of a conventional single gate trench MOSFET.

FIG. 1 is a cross section view of a conventional trench-gate MOSFET 100 which has known physical and performance characteristics and limitations such as cell pitch, break down voltage capability, on-resistance (Rdson), transistor ruggedness. Trench gate 105 extends through P-well 106 and terminates in N-epi region 104. Trench gate 105 includes a gate dielectric 114 lining the trench sidewalls and bottom, and a recessed gate electrode 112. Dielectric layers 116 and 118 insulate gate electrode 112 from overlying source interconnect (not shown).

Figure 2:
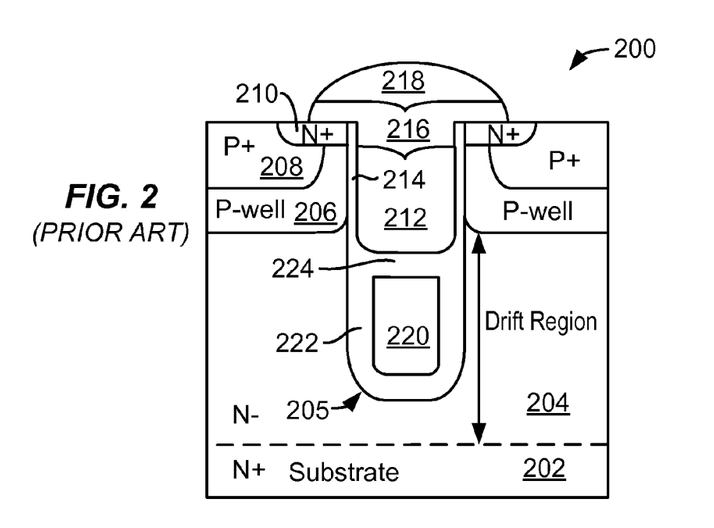
FIG. 2 is a cross section view of a conventional dual gate trench MOSFET.

FIG. 2 is a cross section view of a conventional dual gate trench MOSFET 200 (also referred to as shielded gate trench MOSFET) which improves on certain characteristics of trench-gate trench MOSFET 100 in FIG. 1. The trench 205 includes a shield electrode 220 insulated from the drift region 204 by a shield dielectric layer 222. Trench 205 also includes gate electrode 212 over and insulated from shield electrode 220 by an inter-poly dielectric layer 224. Shield electrode 220 reduces the gate-drain capacitance (Cgd) and improves the breakdown voltage. One drawback of both the single gate transistor 100 and dual gate transistor 200, however, is that the drift region contributes up to about 40% of the total Rdson, significantly limiting improvements in Rdson. For the dual gate trench structure, the deeper trenches exacerbate this problem by requiring even a thicker drift region. Another drawback of trench-gate transistors 100 and 200 is that the high electric field at the bottom of the trench due to the bottom trench curvature, limits improving several performance parameters such as breakdown voltage and transistor ruggedness. Some applications require integration of Schottky diode with power MOSFET. However, such integration typically requires a complex process technology with many process and mask steps.

Thus, there is a need for cost effective structures and methods for forming trench-gate FETs, monolithically integrated diode and MOSFET structures, and termination structures which eliminate or minimize the drawbacks associated with prior art techniques, thus allowing substantial improvements in the physical and performance characteristics of trench-gate FETs.

BRIEF SUMMARY

A field effect transistor includes a body region of a first conductivity type over a semiconductor region of a second conductivity type. A gate trench extends through the body region and terminates within the semiconductor region. At least one conductive shield electrode is disposed in the gate trench. A gate electrode is disposed in the gate trench over but insulated from the at least one conductive shield electrode. A shield dielectric layer insulates the at lease one conductive shield electrode from the semiconductor region. A gate dielectric layer insulates the gate electrode from the body region. The shield dielectric layer is formed such that it flares out and extends directly under the body region.

In one embodiment, the semiconductor region comprises includes a substrate region and a drift region over the substrate region. The body region extends over the drift region, and has a lower doping concentration than the substrate region. The gate trench extends through the drift region and terminates within the substrate region.

In accordance with another embodiment of the invention, a field effect transistor is formed as follows. An upper trench portion extending to a first depth within a semiconductor region is formed. The sidewalls of the upper trench portion are lined with a protective layer of material such that the semiconductor region along at least a portion of the bottom wall of the upper trench portion remains exposed. A lower trench portion is formed extending through the exposed bottom wall of the upper trench portion while with the protective layer of material protects the sidewalls of the upper trench portion. The upper trench portion has a larger width than a width of the lower trench portion.

In one embodiment, a shield dielectric layer is formed along the sidewalls and bottom wall of the lower trench portion. The protective layer of material is removed. A second insulating layer is formed along the sidewalls of the upper trench portion, the first insulating layer having a greater thickness than the second insulating layer.

In another embodiment, the first insulating layer is formed by local oxidation of silicon (LOCOS).

In another embodiment, a conductive shield electrode is formed in the lower trench portion. An interpoly dielectric is formed over the conductive shield electrode, and a gate electrode is formed over the interpoly dielectric.

In accordance with another embodiment of the invention, a field effect transistor includes a body region of a first conductivity type in a semiconductor region of a second conductivity type. A gate trench extends through the body region and terminating within the semiconductor region. A source region of the second conductivity type is in the body region adjacent the gate trench such that the source region and an interface between the body region and the semiconductor region define a channel region extending along the gate trench sidewall. A channel enhancement region of the second conductivity type is adjacent the gate trench. The channel enhancement region partially extends into a lower portion of the channel region to thereby reduce a resistance of the channel region.

In one embodiment, a gate electrode is disposed in the gate trench, and the channel enhancement region overlaps the gate electrode along the trench gate sidewall.

In another embodiment, at least one conductive shield electrode is disposed in the gate trench. A gate electrode is disposed in the gate trench over but insulated from the at least one conductive shield electrode. A shield dielectric layer insulates the at lease one conductive shield electrode from the semiconductor region. A gate dielectric layer insulates the gate electrode from the body region.

In accordance with another embodiment of the invention, a field effect transistor is formed as follows. A trench is formed in a semiconductor region. A shield electrode is formed in the trench. An angled sidewall implant of impurities of the first conductivity type is performed to form a channel enhancement region adjacent the trench. A body region of a second conductivity type is formed in the semiconductor region. A source region of the first conductivity type is formed in the body region such that the source region and an interface between the body region and the semiconductor region defining a channel region extending along the gate trench sidewall. The channel enhancement region partially extends into a lower portion of the channel region to thereby reduce a resistance of the channel region.

In one embodiment, a gate electrode is formed over but insulated from the shield electrode.

In another embodiment, the channel enhancement region is self-aligned to the shield electrode.

In accordance with another embodiment of the invention, a field effect transistor includes a gate trench extending into a semiconductor region. The gate trench has a recessed gate electrode disposed therein. A source region in the semiconductor region flanks each side of the gate trench. A conductive material fills an upper portion of the gate trench so as to make electrical contact with the source regions along at least one sidewall of each of the source regions, the conductive material being insulated from the recessed gate electrode.

In accordance with another embodiment of the invention, a field effect transistor is formed as follows. A trench is formed in a semiconductor region. A recessed gate electrode is formed in the trench. A two-pass angled implant of impurities is performed to form source regions on each side of the trench. A dielectric layer is formed over the recessed gate electrode. The trench is filled with a conductive material such that the conductive material is in electrical contact with the source regions.

In one embodiment, the conductive material comprises doped polysilicon.

A better understanding of the nature and advantages of the present invention can be gained from the following detailed description and the accompanying drawings.

DETAILED DESCRIPTION

The process sequence represented by the cross-section views in FIGS. 13A-13L is an exemplary process for forming a dual gate trench MOSFET in accordance with an embodiment of the invention. This process sequence will be used as the base process which will be modified to include various process modules for forming the different cell structures described below. Note that the process modules described herein may also be integrated with other base processes, and as such are not limited to the process depicted by FIGS. 13A-13L. The process sequence of FIGS. 13A-13L is described next.

Figure 13A:
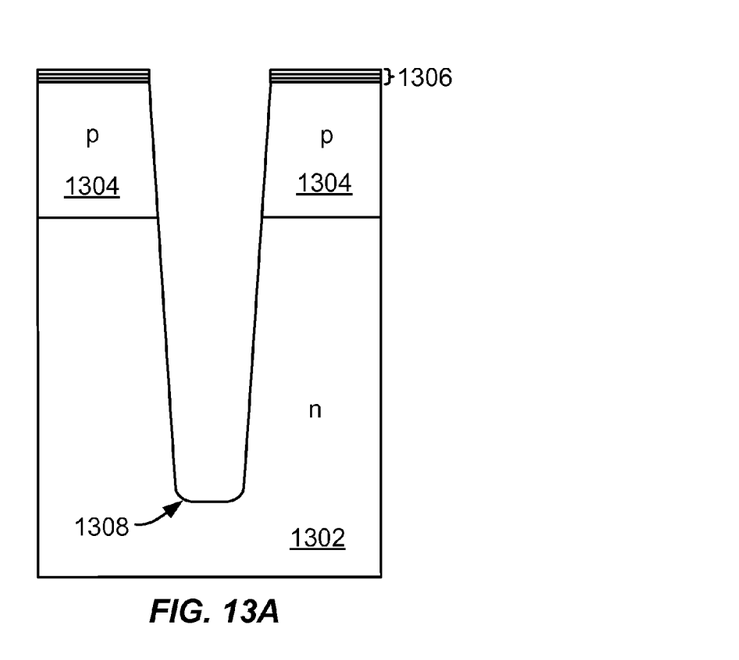
FIGS. 13A-13L are cross section views at various steps of an exemplary manufacturing process for forming a dual gate trench MOSFET, in accordance with an embodiment of the invention.

In FIG. 13A, an n-type epitaxial layer 1302 is formed over a heavily doped n-type substrate (not shown). Dopants of p-type conductivity are implanted to form a body region 1304 in epitaxial layer 1302. A hard mask 1306, e.g., comprising oxide-nitride-oxide (ONO) composite layer, is used to define and etch trenches 1308 extending through body region 1304 and into epitaxial layer 1302.

Figure 13B:
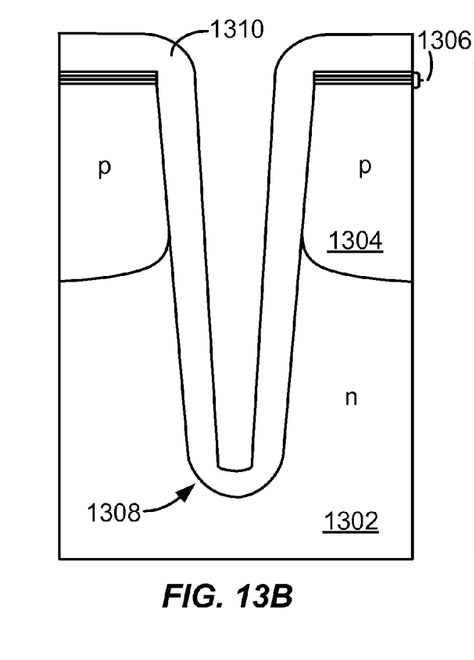
Figure 13C:
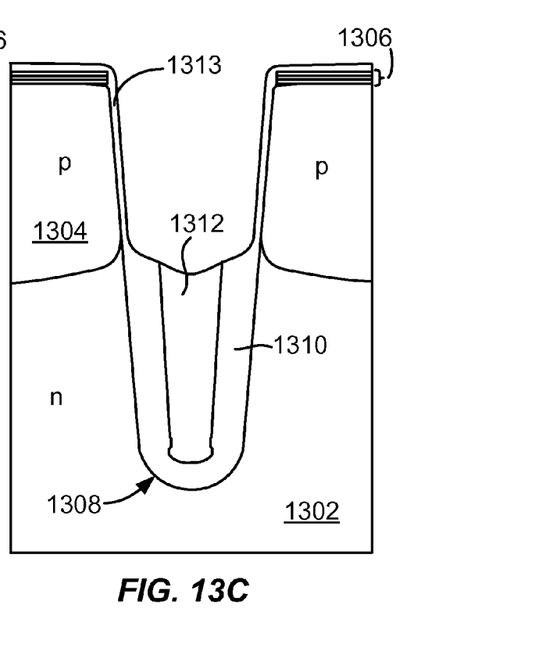

In FIG. 13B, a shield dielectric layer 1310 (e.g., comprising oxide) is formed lining the trench sidewalls and bottom and extending over hard mask 1306, using conventional techniques. In FIG. 13C, a shield electrode 1312 is formed by depositing a layer of polysilicon to fill trench 1308 and then etching back the polysilicon to recess the polysilicon deep into trench 1308. Shield dielectric 1310 is then recessed leaving a thin layer of dielectric 1313 on upper trench sidewalls. Shield electrode 1312 is further recessed to level its top surface with that of the recessed shield dielectric.

Figure 13D:
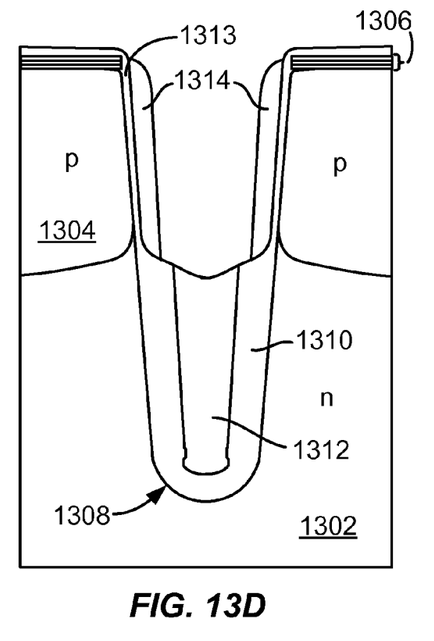
Figure 13E:
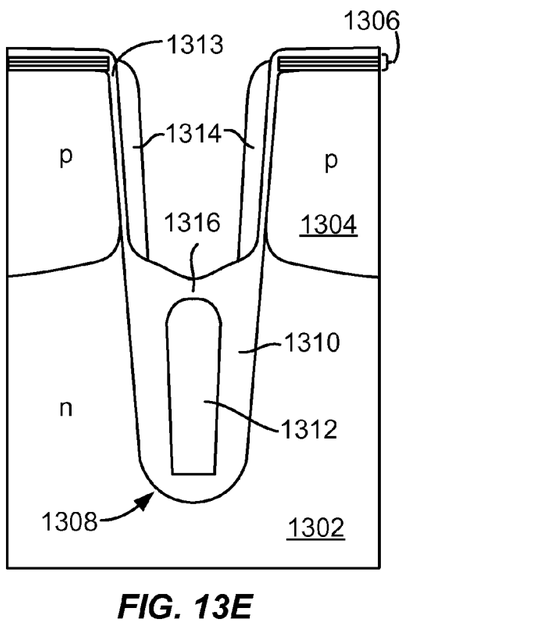

In FIG. 13D, a layer of nitride is deposited and then anisotropically etched so that only portions 1314 of the nitride layer extending along the trench sidewalls remain. In FIG. 13E, an interpoly dielectric (IPD) 1316 is formed by carrying out thermal oxidation. A layer of oxide forms only over shield electrode 1312 since all other silicon surfaces are covered either by nitride or by oxide. In an alternate embodiment, the process sequence is modified to accommodate forming the IPD layer using two oxide layers. First a layer of thermal oxide is formed over the shield electrode, and then, a conformal layer of oxide is deposited using SACVD in order to obtain a uniform IPD layer.

Figure 13F:
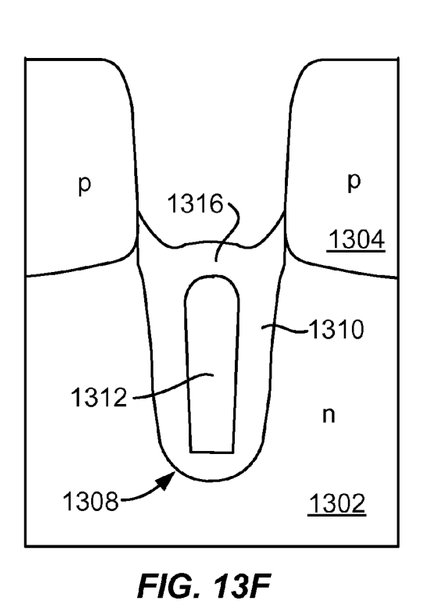
Figure 13G:
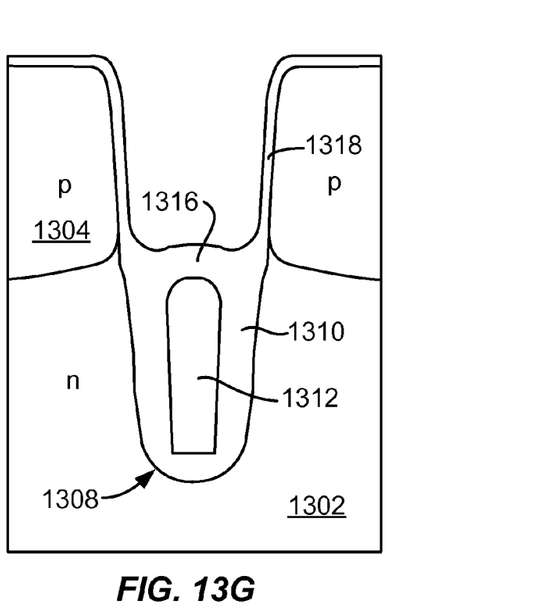
Figure 13H:
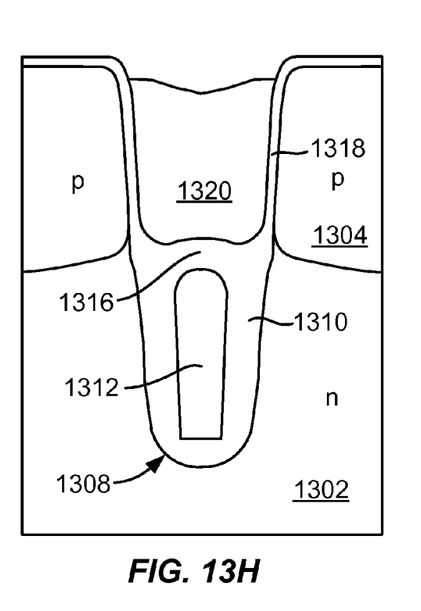

In FIG. 13F, an oxide etch is carried out to remove the top oxide layer of the ONO composite layer 1306 along with any oxide formed over the nitride layer along the trench sidewalls. The now exposed nitride layer of the ONO composite layer and nitride layer 1314 along the trench sidewalls are then stripped. Another oxide etch is carried out to remove the dielectric layer 1313 from along the trench sidewalls as well as the bottom oxide layer of the ONO composite layer 1306 so that silicon is exposed along trench sidewalls and the mesa regions adjacent the trench as shown in FIG. 13F. In FIG. 13G, a gate dielectric layer 1318 extending along trench sidewalls, over the interpoly dielectric layer, and over the mesa regions adjacent the trench is formed using known techniques. In FIG. 13H, a layer of polysilicon is deposited which fills the trench, and is then etched back to form the recessed gate electrode 1320 in the trench.

Figure 13I:
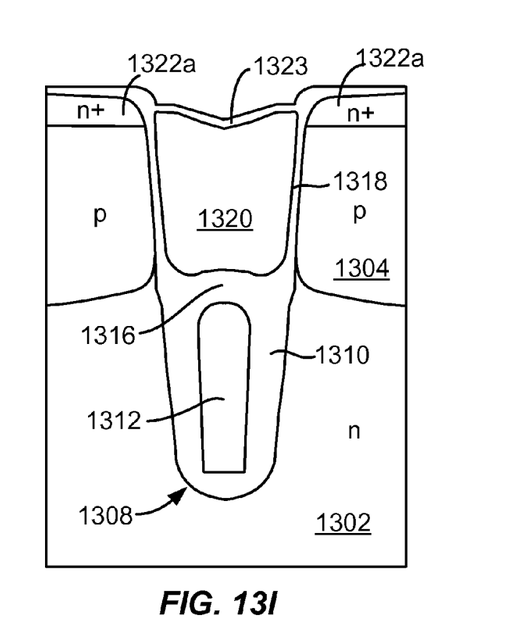
Figures 13J, 13K:
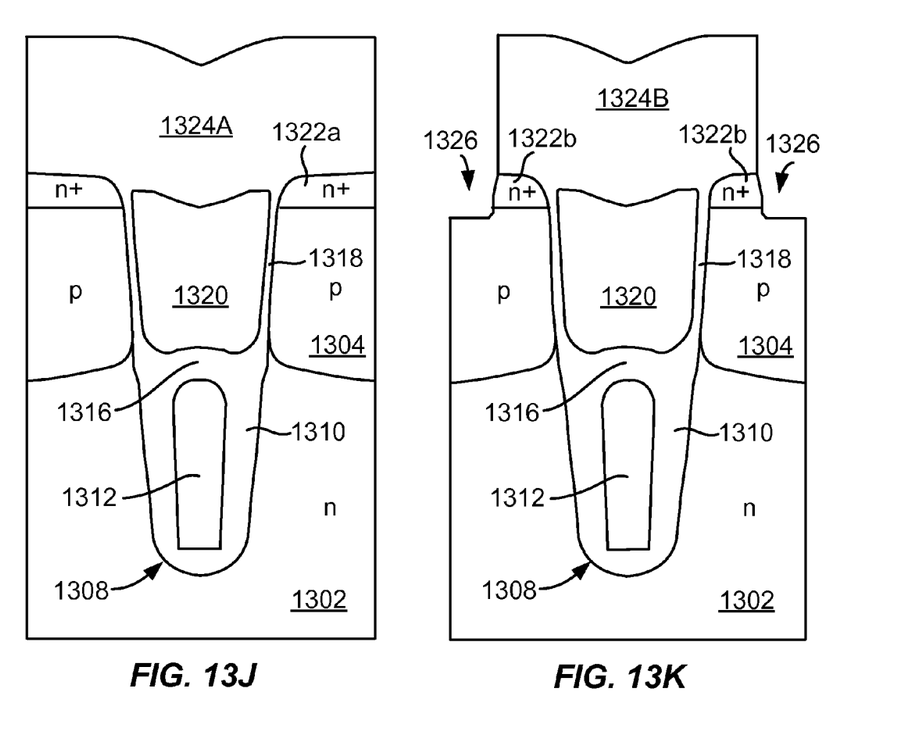
Figure 13L:
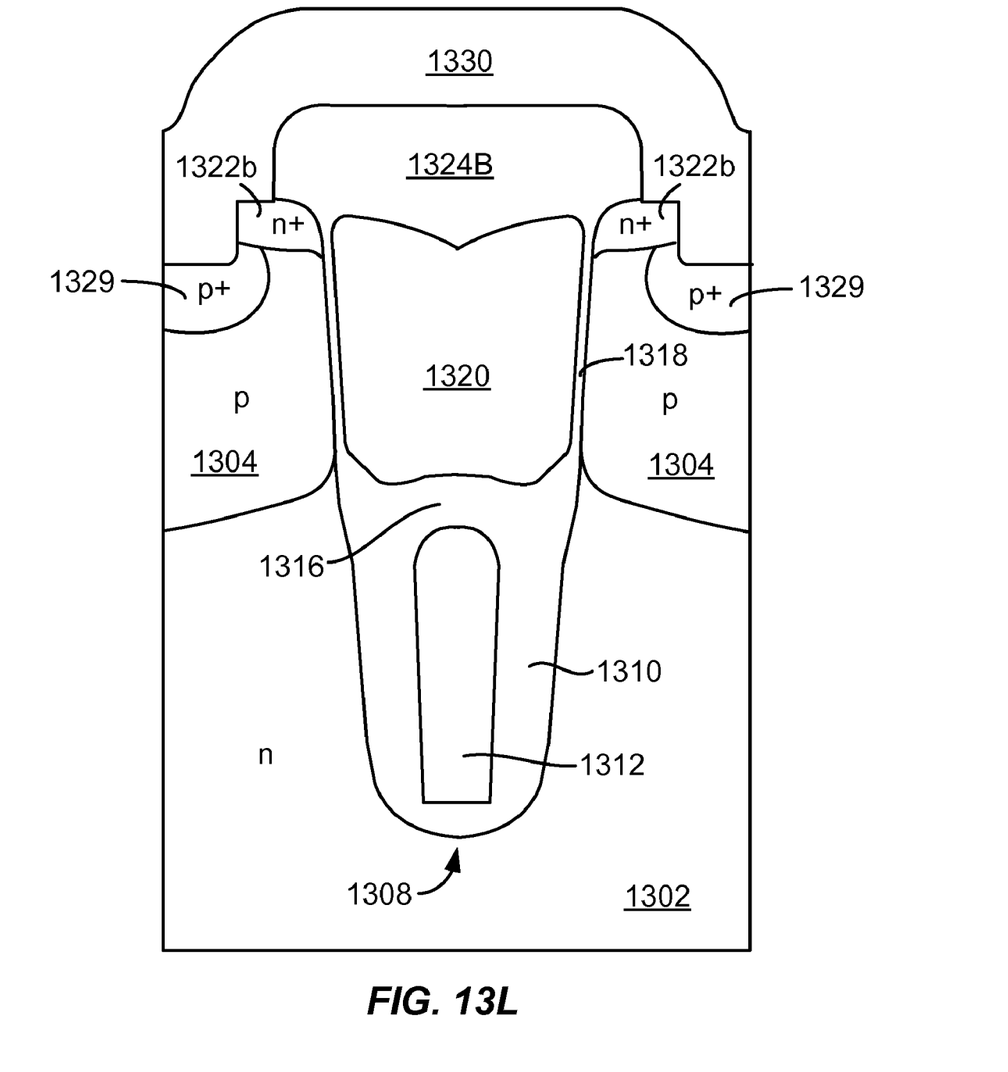

In FIG. 13I, the gate dielectric over the mesa is etched back to a thickness suitable for source implant. A blanket source implant in the active region is carried out to form n-type regions 1322s extending between adjacent trenches in the mesa regions. In FIG. 13J, a layer of BPSG 1324A is formed over the trench and the mesa using conventional methods. In FIG. 13K, using a masking layer (not shown), BPSG layer 1324A is removed except for portion 1324B over the trench and n-type regions 1322a. Silicon mesa surfaces adjacent BPSG portion 1324 are thus exposed. A silicon etch is then carried out to recess the exposed silicon surfaces to a depth below n-type regions 1322a, thus forming contact openings 1326. The silicon recess removes a portion of each n-type region 1322a, leaving behind self-aligned source regions 1322b. In FIG. 13L, a heavy body implant is carried out to form self-aligned heavy body regions 1329 of p-type conductivity in body region 1304. A BPSG reflow is carried out to obtain a better aspect ratio for the contact openings and a better step coverage for a source interconnect layer 1330 formed next. Source interconnect 1330 electrically contacts heavy body regions 1329 and source regions 1322.

Figure 3:
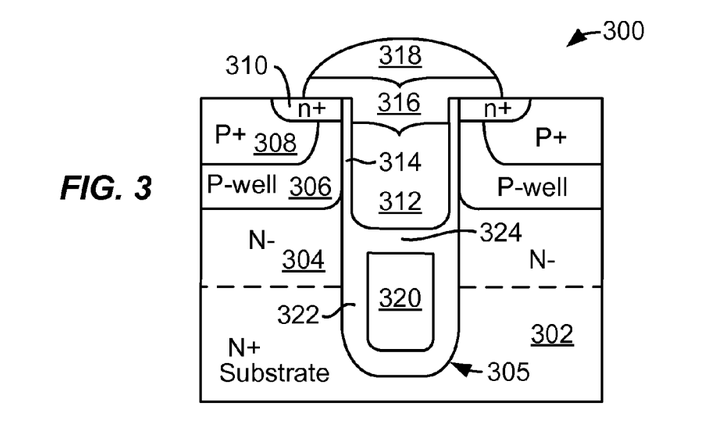
FIG. 3 is a cross section view of a dual gate trench MOSFET with the gate trench shield electrode extending into the substrate, in accordance with an embodiment of the invention.

Various cell structures, their corresponding process modules, and the manner in which these process modules can be integrated with the process flow depicted by FIGS. 13A-13L will be described next. FIG. 3 shows a cross section view of a dual gate trench MOSFET 300 which is structurally similar to the dual gate MOSFET in FIG. 13L, except that the trench 305 and the shield electrode 320 are extended into the substrate 302. This advantageously enables the thickness of the drift region to be substantially reduced thus improving Rdson. Additionally, the high doping concentration of the substrate moves the potential drop into the shield oxide and thus removes the curvature-limited breakdown problems associated with conventional trench structures. This also improves device ruggedness as the avalanche point (i.e. maximum impact ionization rate) is moved to the center of the transistor mesa and away from the parasitic bipolar elements associated with triggering ruggedness failures. The only modification to the process sequence in FIGS. 13A-13L needed is that in FIG. 13A a thinner epitaxial layer needs to be formed over the substrate so that the trenches reach into the substrate.

Figure 4:
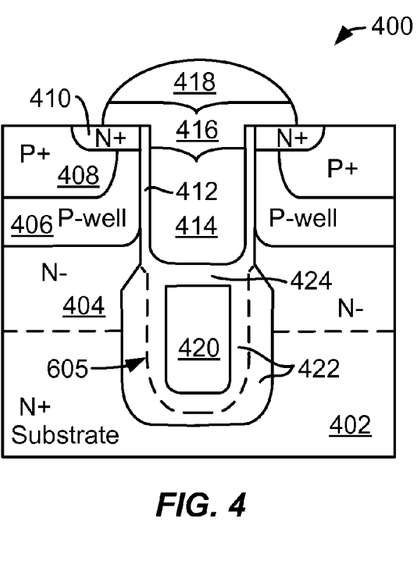
FIG. 4 is a cross section view of a dual gate trench MOSFET wherein the shield dielectric is formed using LOCOS process, in accordance with another embodiment of the invention.

FIG. 4 shows a cross section view of a dual gate trench MOSFET 400 wherein the shield dielectric 422 is formed using LOCOS process, in accordance with an embodiment of the invention. The dashed line shows the contours of the trench 605. In forming the shield dielectric 422, the LOCOS process results in consumption of the silicon adjacent trench 605 thus causing the shield dielectric 433 to flare out and extend directly under body regions 406. The LOCOS process is advantageously a cost effective method of forming the shield dielectric 422, and also yields a uniform film. The upper portion of MOSFET 400 is similar to the upper portion MOSFET 300 in FIG. 3. While trench 605 and the shield electrode 420 are shown extending into substrate 402, they may alternatively terminate in N-region 404 similar to that shown in MOSFET 200 in FIG. 2. In one embodiment, MOSFET 400 is formed by integrating the process module depicted by the cross-section views in FIGS. 10A-10E with the process flow of FIGS. 13A-13L as follows.

Figure 10A:
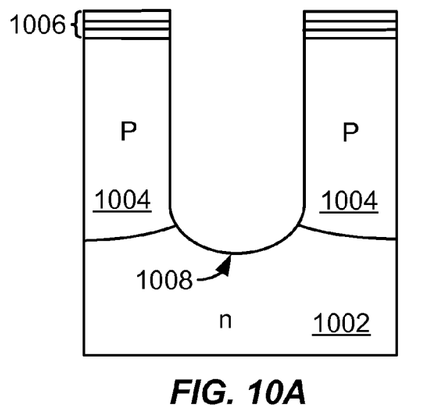
FIGS. 10A-10E are cross section views at various process steps of a process module used in forming MOSFET 400 in FIG. 4, in accordance with another embodiment of the invention.
Figure 10B:
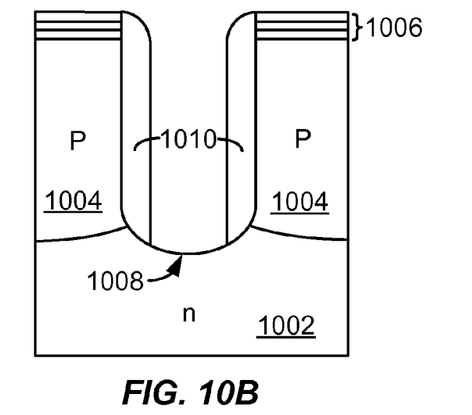
Figure 10C:
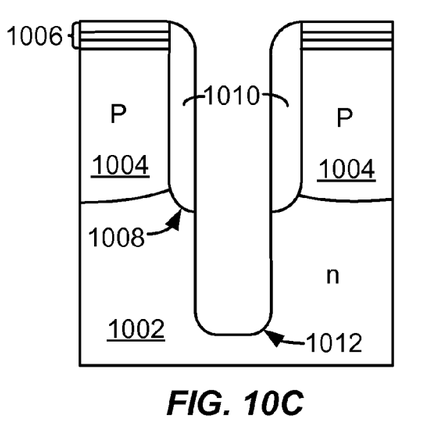
Figure 10D:
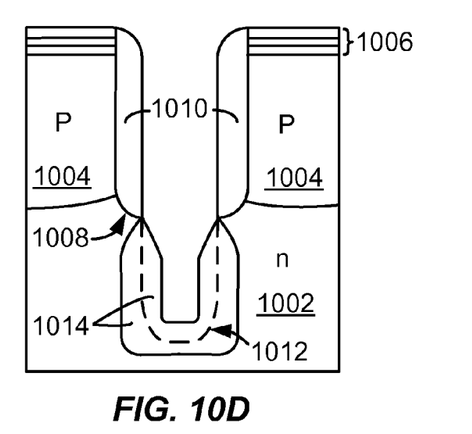
Figure 10E:
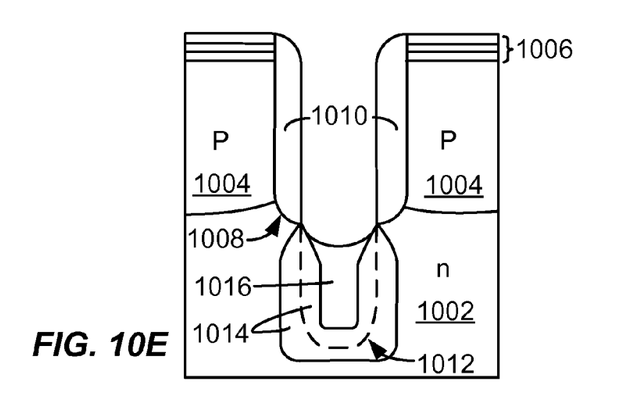

The process steps corresponding to FIGS. 13A-13D are replaced with the process steps corresponding to FIGS. 10A-10E. The process steps corresponding to FIG. 10A are the same as those corresponding to FIG. 13A except that in FIG. 10A a shallower trench 1008 extending just past body region 1004 is formed. In FIG. 10B, nitride spacers 1010 are formed along trench sidewalls. In FIG. 10C, a silicon etch (self-aligned to nitride spacers 1010) is carried out to thereby extend trench 1008 deeper into silicon region 1002. The gate trench thus has a wider upper portion 1008 and a narrower lower portion 1012. In FIG. 10D, a LOCOS process is carried out whereby a self-aligned layer of shield dielectric 1014 is formed along exposed silicon surfaces, i.e., in the lower trench portion 1012. The LOCOS process consumes portions of silicon region 1002 as shown (the dashed line shows the contours of the lower trench portion 1012). In FIG. 10E, a shield electrode 1016 is formed in the trench by depositing a layer of polysilicon and then etching back the polysilicon to recess the polysilicon deep into the trench. The process steps corresponding to FIGS. 13E-13L are carried out next to complete the cell structure. The thicknesses and sizes of the different layers and regions in the figures may not be to scale. For example, in FIG. 10D, nitride spacers 1010 would in practice be thinner than they appear such that the portions of LOCOS shield dielectric 1014 that flare out, extend directly under body regions 1004.

Figure 5:
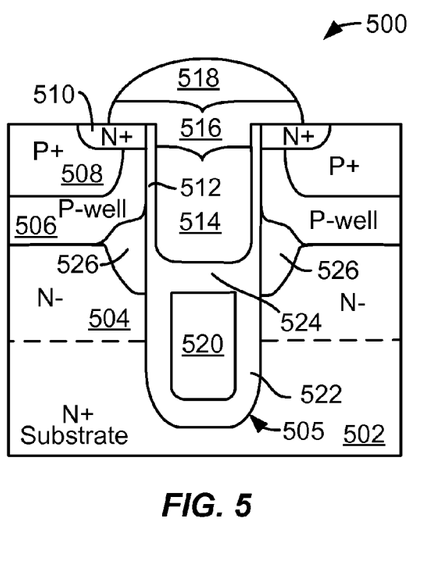
FIG. 5 is a cross section view of a dual gate trench MOSFET with sidewall channel enhancement regions, in accordance with another embodiment of the invention.

FIG. 5 shows a cross section view of a dual gate trench MOSFET 500 which is similar to MOSFET 300 in FIG. 3, except that sidewall channel enhancement regions 526 are incorporated in MOSFET 500, in accordance with another embodiment of the invention. A channel enhancement region 526 is formed along a bottom portion of each channel region of MOSFET 500 to compensate for the tail of the doping concentration profile in the channel. The channel length and the channel resistance are thus advantageously reduced. Because the peak of the doping concentration in the channel region occurs just beneath source regions 510 (i.e., is away from the bottom of the channel region), the addition of channel enhancement regions 526 does not adversely impact the transistor threshold voltage. Given that MOSFET 500 is n-channel, channel enhancement regions 526 would be n-type. As in previous embodiments, MOSFET 500 may be modified so that trench 505 terminates in drift region 504 rather than in substrate 502. In one embodiment, MOSFET 500 is formed by integrating the process module depicted by the cross-section view in FIG. 11 with the process flow of FIGS. 13A-13L as follows.

Figure 11:
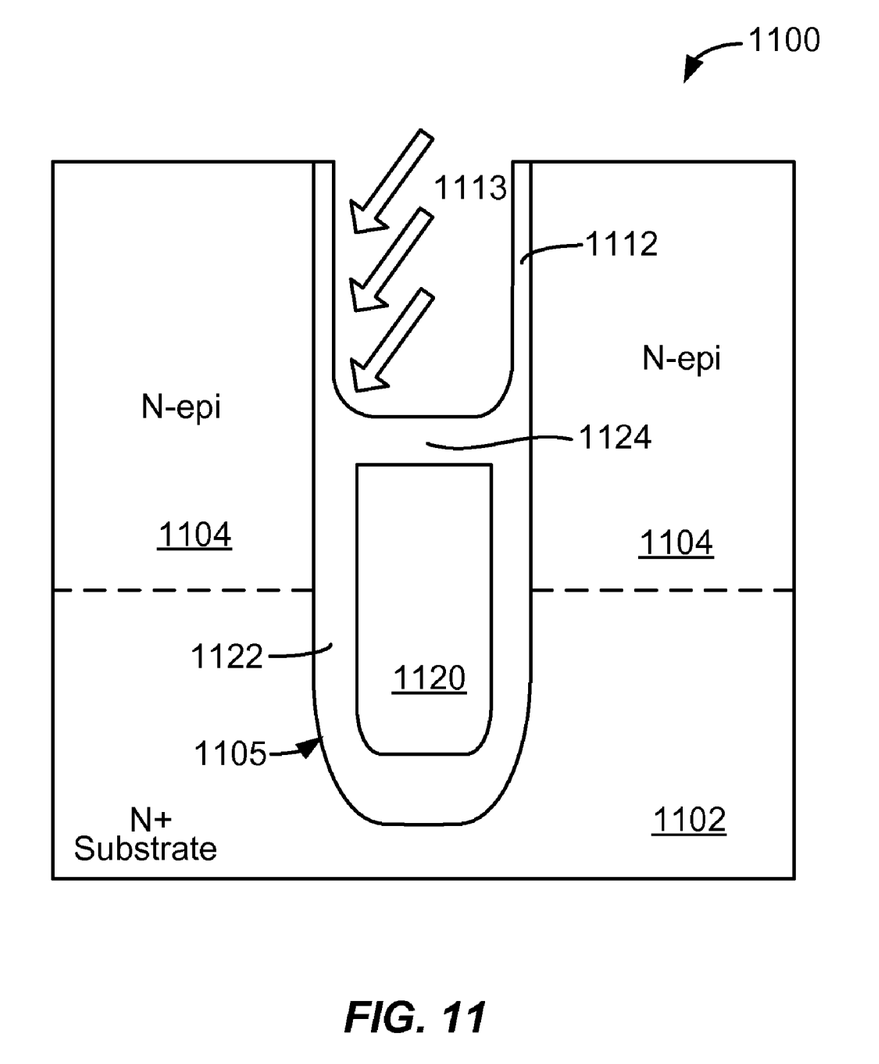
FIG. 11 is a cross section view corresponding to a process module used in forming MOSFET 500 in FIG. 5, in accordance with another embodiment of the invention.

The process module corresponding to FIG. 11 needs to be carried out after FIG. 13F but before FIG. 13G. That is, after carrying out the steps corresponding to FIGS. 13A-13F, a screen oxide 1112 is formed along the trench sidewalls as shown in FIG. 11. Screen oxide 1112 needs to be of a thickness suitable for implanting dopants through it. In FIG. 11, a channel enhancement implant 1113 of n-type dopants is carried out at a predetermined angle to form a channel enhancement region along one trench sidewall, and a second channel enhancement implant is carried out at an opposite angle to that shown in FIG. 11 to form a channel enhancement region along the opposite trench sidewall. The channel enhancement regions would be self-aligned to the IPD 1124 formed in previous steps. The process steps corresponding to FIGS. 13G-13L are then carried out to complete the cell structure. In one embodiment, the body region is formed prior to the channel enhancement implant 1113, and in an alternate embodiment, the body region is formed after the channel enhancement implant 1113.

Figure 6:
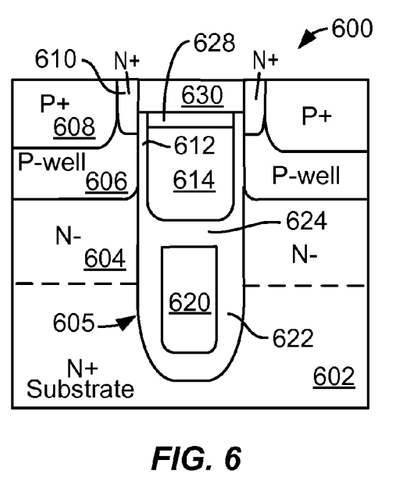
FIG. 6 is a cross section view of a dual gate trench MOSFET with a source plug region, in accordance with another embodiment of the invention.

FIG. 6 shows a cross section view of a dual gate trench MOSFET 600 with a source plug region 630, in accordance with another embodiment of the invention. Instead of forming a dielectric dome over gate electrode 614 as is done in FIG. 3, a thin dielectric layer 628 is formed over the gate electrode 614 and the remaining portion of the trench 605 over dielectric layer 628 is filled with a source plug 630 (e.g., comprising polysilicon). Source plug 630 electrically connects source regions 610 flanking the gate trench 605. MOSFET 600 has the advantage of providing a planar surface for forming the top-side metal. Further, the source plug enables forming very narrow source regions on the sides of the trench, thus reducing the cell pitch without adversely impacting the source resistance. The narrow source regions 610 are formed by carrying out a two-pass angled implant before forming source plug 630. MOSFET 600 may be modified so that trench 605 terminates in drift region 604 rather than in substrate 602. Source plug 630 may be incorporated in conventional trench gate FETs, such as that in FIG. 1, in a similar manner. In one embodiment, MOSFET 600 is formed by integrating the process module depicted by the cross-section views in FIGS. 12A-12D with the process flow of FIGS. 13A-13L as follows.

Figure 12A:
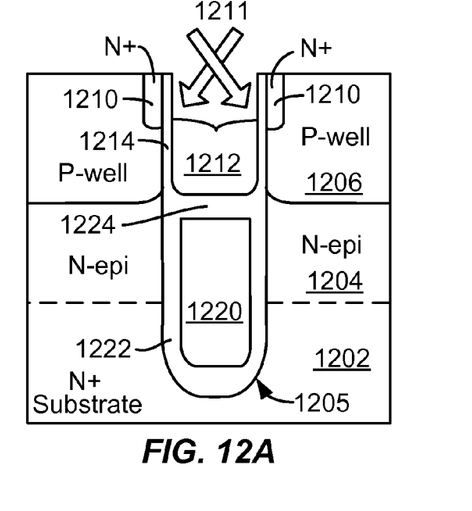
FIGS. 12A-12D are cross section views at various process steps of a process module used in forming MOSFET 600 in FIG. 6, in accordance with another embodiment of the invention.
Figure 12B:
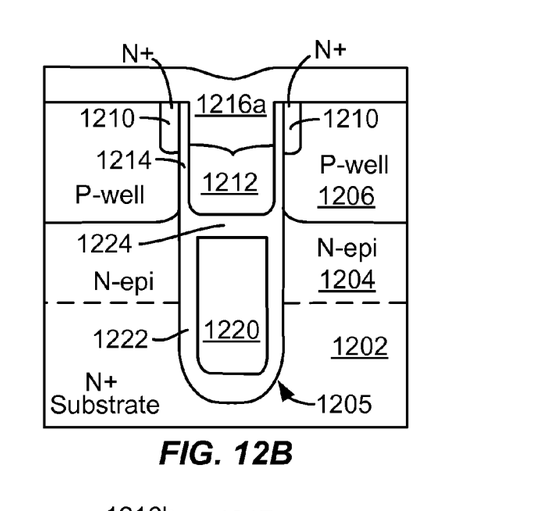
Figure 12C:
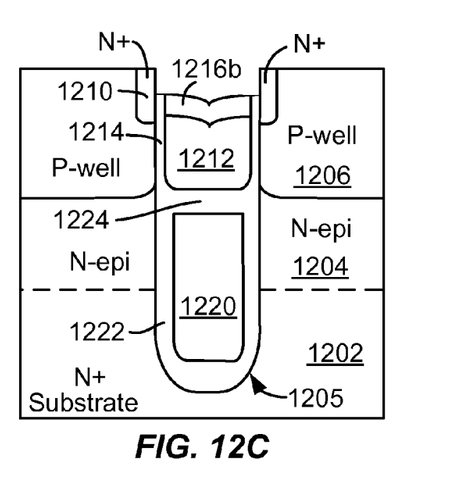
Figure 12D:
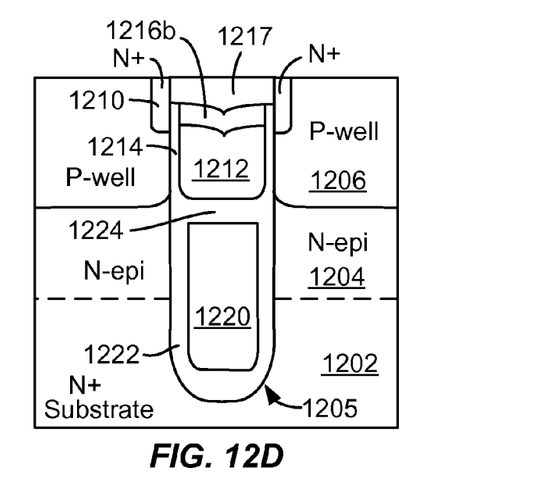

The process steps corresponding to FIGS. 13H-13L are replaced with the process steps corresponding to FIGS. 12A-12D. That is, after carrying out the steps corresponding to 13A-13G, the gate electrode is formed in a similar manner to that in FIG. 13H except that the deposited gate polysilicon is recessed deeper into the trench as shown in FIG. 12A. In FIG. 12A, a two-pass angled implant of n-type dopants is carried out to form source regions 1210 along the exposed upper sidewalls of trench 1205. Next, as shown in FIG. 12B, a dielectric layer 1216a (e.g., comprising oxide) is deposited with a differential fill so that a thicker oxide is formed over gate electrode 1212 in the trench than over the adjacent mesa. In FIG. 12C, dielectric layer 1216a is uniformly etched whereby a thin layer of dielectric 1216b remains in the trench over gate electrode 1212. In FIG. 12C, trench 1205 is filled with doped polysilicon 1217. Conventional techniques are then used to form the heavy body region (no shown), the source interconnect (not shown), and other regions and layers in order to complete the cell structure. Source plug 1217 may be incorporated in the trench gate FET 100 in FIG. 1 by integrating the process module represented by FIGS. 12A-12D in conventional process sequences for forming the trench gate FET 100, in a similar manner.

Figure 7:
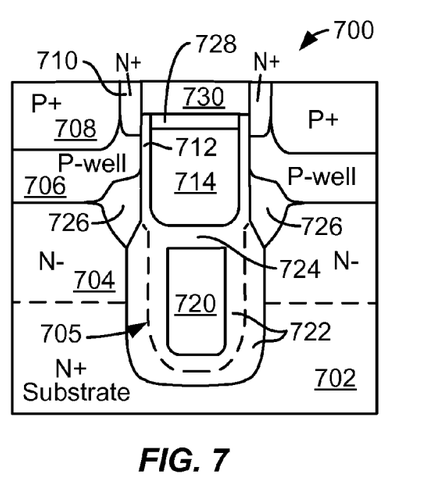
FIG. 7 is a cross section view of a composite dual gate trench with sidewall channel enhancement region, source plug region, and LOCOS shield dielectric, in accordance with another embodiment of the invention.

FIG. 7 shows a cross section view of a composite dual gate trench MOSFET 700 wherein the advantageous features of the structures in FIGS. 4-6 have been combined. As shown, n-type channel enhancement regions 726, source plug 730, and LOCOS shield dielectric 722 are incorporate in MOSFET 700. Note that any two of the three features may be combined rather than all three, depending on the design goals and performance requirements. The alternate embodiments of each of the MOSFETs 400, 500, 600 discussed above also apply to MOSFET 700. The modifications that need to be made to the process flow in FIGS. 13A-13L to form MOSFET 700 would be obvious to one skilled in the art in view of this disclosure.

Figure 8:
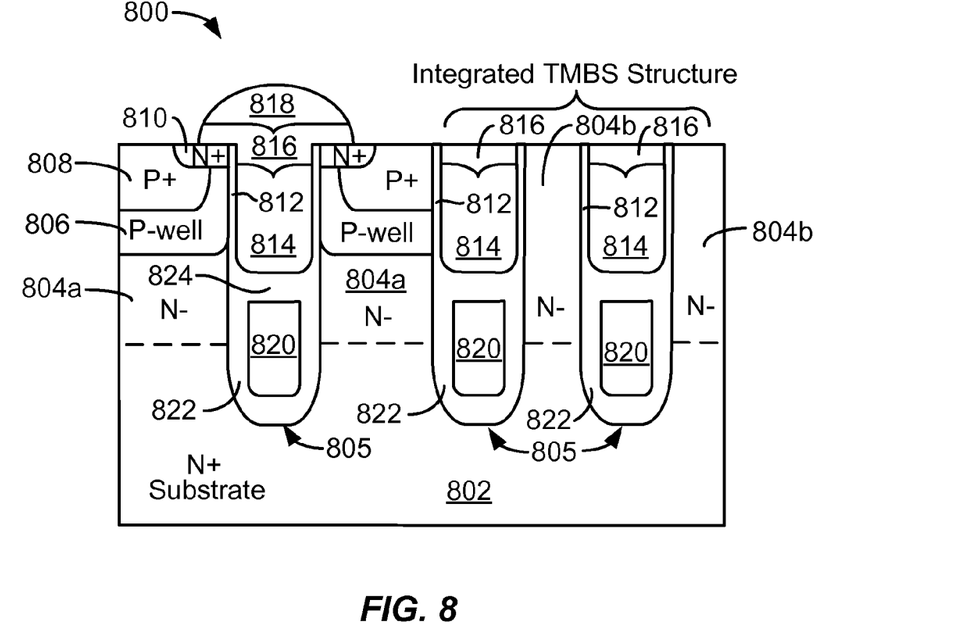
FIG. 8 is a cross-section view of a dual gate trench MOSFET monolithically integrated with Schottky diode, in accordance with another embodiment of the invention.

FIG. 8 shows a cross-section view of a dual gate trench MOSFET monolithically integrated with a Schottky diode to obtain an integrated MOSFET-Schottky diode structure 800. As can be seen, the MOSFET structure is similar to that in FIG. 3, although any of the MOSFETs in FIGS. 4-7 may be used instead. In FIG. 8, the source interconnect (not shown) comprises a Schottky barrier metal which not only contacts source regions 810 and heavy body regions 808, but also extends over the Schottky diode region and makes electrical contact with N-regions 804b. The Schottky barrier metal in contact with the lightly doped region 804b forms a Schottky diode. The structure of the trenches in the Schottky diode region is identical to those in the MOSFET regions. The Schottky diode structures are incorporated in the active region as frequently as necessary to achieve the desired ratio of MOSFET to Schottky area.

Figure 9:
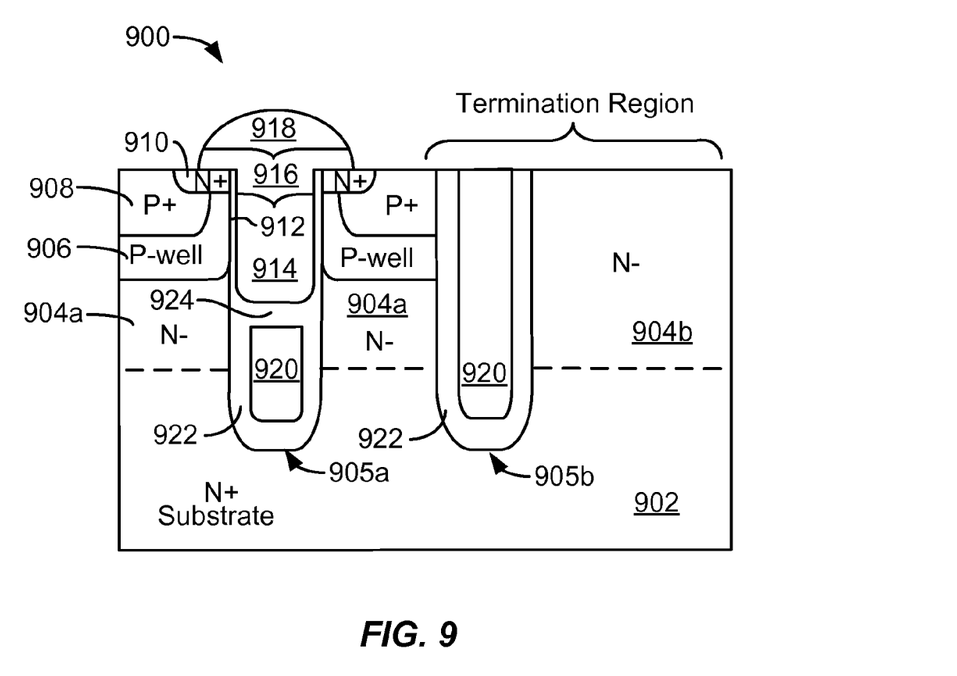
FIG. 9 shows a compact edge termination structure integrated with a dual gate trench MOSFET, in accordance with another embodiment of the invention.

FIG. 9 shows a compact edge termination structure integrated with the dual gate trench MOSFET. As can be seen, the active region is terminated in a termination trench 905b which includes a shield dielectric lining the trench sidewalls and bottom, and a shield electrode 920 filling the trench. As can be seen, the MOSFET structure in the active region is similar to that in FIG. 3, although any of the MOSFETs in FIGS. 4-7 may be used instead.

The various embodiments of the invention described herein, may be combined with one or more of the embodiments (in particular the shielded gate trench structures and processes) described in the above-referenced commonly assigned U.S. patent application Ser. No. 11/026,276 to obtain power devices with superior characteristics.

While the above provides a detailed description of various embodiments of the invention, many alternatives, modifications, and equivalents are possible. For example, the above process sequences and process modules are described in the context of the dual gate (shielded gate) trench structure, however the advantageous features of the various embodiments disclosed herein may also be implemented in the context of the traditional trench-gate FETs such as that shown in FIG. 1. Furthermore, it is to be understood that all material types provided herein are for illustrative purposes only. Moreover, one or more of the various dielectric layers in the embodiments described herein may comprise low-k or high-k dielectric material. For example, one or more of the dielectric layers formed before the first polysilicon deposition may comprise high-k dielectric material, while one or more of the dielectric layers formed after the last polysilicon deposition may comprise low-k dielectric material. For this and other reasons, therefore, the above description should not be taken as limiting the scope of the invention, which is defined by the appended claims.

What is claimed is:

1. A method of forming a field effect transistor, comprising:
   forming a trench in a semiconductor region;
   forming a shield electrode in the trench;
   performing an angled sidewall implant of impurities of the first conductivity type to form a channel enhancement region adjacent the trench;
   forming a body region of a second conductivity type in the semiconductor region; and
   forming a source region of the first conductivity type in the body region, the source region and an interface between the body region and the semiconductor region defining a channel region therebetween, the channel region extending along the trench sidewall,
   wherein the channel enhancement region partially extends into a lower portion of the channel region to thereby reduce a resistance of the channel region.

2. The method of claim 1 further comprising forming a gate electrode over but insulated from the shield electrode.

3. The method of claim 2 wherein the channel enhancement region overlaps with the gate electrode along the trench sidewall.

4. The method of claim 1 wherein the channel enhancement region is self-aligned to the shield electrode.

5. The method of claim 1 wherein the semiconductor region includes a drift region of the second conductivity type extending over a substrate.

6. The method of claim 5 wherein the trench extends through the drift region and terminates within the substrate.

7. The method of claim 5 wherein the channel enhancement region partially extends into the body region and partially extends into the drift region.

8. The method of claim 1 wherein the semiconductor region includes a drift region of the second conductivity type extending over a substrate, and the shield electrode vertically overlaps the drift region and the substrate.

9. The method of claim 1 further comprising:
forming a screen oxide along the upper trench sidewalls prior to performing the angled sidewall implant.

10. A method of forming a shielded gate field effect transistor, comprising:
forming trenches in a semiconductor region;
forming a shield electrode in each trench, the shield electrode being insulated from the semiconductor region;
performing angled sidewall implants of impurities of the first conductivity type to form channel enhancement regions adjacent each trench along opposing sidewalls of each trench;
forming a body region of a second conductivity type in the semiconductor region; and
forming source regions of the first conductivity type in the body region, each source region and an interface between the body region and the semiconductor region defining a channel region therebetween, the channel region extending along the corresponding trench sidewall,
wherein each channel enhancement region partially extends into a lower portion of the corresponding channel region to thereby reduce a resistance of the channel region.

11. The method of claim 10 further comprising forming a gate electrode in each trench over but insulated from the shield electrode.

12. The method of claim 11 wherein channel enhancement regions overlap with corresponding gate electrodes along corresponding trench sidewalls.

13. The method of claim 10 wherein the channel enhancement regions are self-aligned to corresponding shield electrodes.

14. The method of claim 10 wherein the semiconductor region includes a drift region of the second conductivity type extending over a substrate.

15. The method of claim 14 wherein the trenches extend through the drift region and terminate within the substrate.

16. The method of claim 14 wherein the channel enhancement regions partially extend into the body region and partially extend into the drift region.

17. The method of claim 10 wherein the semiconductor region includes a drift region of the second conductivity type extending over a substrate, and the shield electrode in each trench vertically overlaps the drift region and the substrate.

18. The method of claim 10 further comprising:
forming a screen oxide along upper sidewalls of each trench prior to performing the angled sidewall implants.

* * * * *